(12) United States Patent
Horne et al.

(10) Patent No.: US 7,545,011 B2
(45) Date of Patent: Jun. 9, 2009

(54) SEMICONDUCTOR MOUNT

(75) Inventors: Stephen Horne, El Granada, CA (US); Gary D. Conley, Saratoga, CA (US)

(73) Assignee: SolFocus, Inc., Mountain View, CA (US)

( * ) Notice: Subject to any disclaimer, the term of this patent is extended or adjusted under 35 U.S.C. 154(b) by 149 days.

(21) Appl. No.: 11/509,944

(22) Filed: Aug. 24, 2006

(65) Prior Publication Data

US 2008/0123313 A1 May 29, 2008

(51) Int. Cl.
*H01L 27/14* (2006.01)
*H01L 21/00* (2006.01)

(52) U.S. Cl. .................. 257/414; 257/431; 257/432; 257/E31.127; 257/E27.123; 438/22; 438/29

(58) Field of Classification Search .............. 438/22, 438/25, 26, 29; 257/414, 431, 342
See application file for complete search history.

(56) References Cited

U.S. PATENT DOCUMENTS

| 2005/0046977 | A1 | 3/2005 | Shifman | |
|---|---|---|---|---|
| 2006/0169315 | A1 | 8/2006 | Levin | |
| 2008/0000516 | A1* | 1/2008 | Shifman | 136/246 |

OTHER PUBLICATIONS

José L. Álvarez et al., "RXI concentrator for 1000X photovoltaic energy conversion", 9 pages, Pro. SPIE, vol. 3781, 30(1999).

William P. Mulligan et al., "Development of Chip-Size Silicon Solar Cells,", 6 pages, Photovoltaic Specialists Conference, Sep. 15, 2000.
A. W. Bett et al., "Flatcon™ and Flashcon™ Concepts for High Concentration PV", Jun. 7-11, 2004, 4 pages.
Jeffrey M. Gordon et al., "Optical performance at the thermodynamic limit with tailored imaging designs", Applied Optics, in press, Dec. 2004, pp. 1-16. W.
W. P. Mulligan et al., "A Flat-Plate Concentrator: Micro-Concentrator Design Overview", 2000, pp. 1495-1497.
Richard M. Swanson, "The Promise of Concentrators", Prog. Photovolt. Res. Appl. 8, pp. 93-111 (2000).
Luu Nguyen, "Wafer Level Packaging for Analog/Mixed Signal Applications", Aug. 22, 2002, pp. 1-41.

* cited by examiner

*Primary Examiner*—Hsien-ming Lee
(74) *Attorney, Agent, or Firm*—The Mueller Law Office, P.C.

(57) ABSTRACT

A mount for a semiconductor device has a first surface with at least one contact region and a second surface. The mount has a substrate to receive the second surface of the semiconductor device and a planar element. The planar element has an aperture sized to surround the semiconductor. A first surface of the planar element is mounted to the substrate and is located to surround the semiconductor device such that the semiconductor device is aligned by the aperture. The mount further has means for mounting the semiconductor device to the substrate in an aligned position. Some embodiments include a method of making and/or using such a mount.

20 Claims, 10 Drawing Sheets

SEMICONDUCTOR MOUNT

FIELD OF THE INVENTION

The present invention is related to the field of semiconductor devices. More specifically, the present invention is directed to semiconductor mount.

BACKGROUND

Currently, there exists a myriad of semiconductor device types that drive modem electronic equipment. Despite their progressive evolution, the development and manufacture of such devices and equipment are constantly plagued by recurring issues. One area of challenge is the mounting of semiconductor devices in a useful structure. Semiconductor devices generally have thermal and/or electrical properties that govern how they can be implemented and used.

In particular, energy conversion semiconductors, such as photovoltaic cells, have even further requirements in terms of optical and physical alignment, and connectivity. Historically, these requirements have contributed prohibitively to the cost of mounting optical or photo voltaic semiconductor devices in useful structures and products. More specifically, researchers have implemented reflective type architectures for optical and/or solar concentrators. At the center of these architectures are solar cells that are used for the conversion of light waves into electric current. As is known in the art, solar cells such as photo voltaic cells operate at certain efficiencies when exposed to sun light. However, by employing reflective principles researchers have increased the efficiency of these cells, in part, by concentrating the light directed onto a cell to the equivalent of more than a single sun. However, as mentioned above, the implementation of these architectures and their respective components has met with certain challenges, particularly relating to design, manufacture, reliability, and cost.

SUMMARY OF THE DISCLOSURE

A mount for a semiconductor device is disclosed. In a particular embodiment, the semiconductor device has a first surface with at least one contact region and a second surface. The mount has a substrate to receive the second surface of the semiconductor device and a planar element. The planar element has an aperture sized to surround the semiconductor. A first surface of the planar element is mounted to the substrate and is located to surround the semiconductor device such that the semiconductor device is aligned by the aperture. The mount further has means for mounting the semiconductor device to the substrate in an aligned position.

The semiconductor device is typically an energy conversion type cell. Preferably, the planar element is mounted to the substrate in a predetermined location. The planar element typically includes a flexible material such as, for example, a polyimide type material, a liquid crystal polymer such as available from 3M or a polyester, which is also preferably electrically insulated. The planar element of some embodiments further includes at least one conductive trace that is electrically coupled to at least one contact region.

In another embodiment, the planar element further includes an integrally formed flap extending into the aperture and sized to overlap the semiconductor device. The flap of some of these embodiments preferably includes an exposed conductive trace on the first surface. The conductive trace is positioned to electrically couple to the at least one contact region. Some embodiments include several flaps. Each of the flaps has a conductive trace for making contact to a contact region. The planar element is typically implemented to have multiple apertures. Each of these apertures is preferably adapted to receive and align a semiconductor device. In some embodiments, each aperture has at least one flap. The semiconductor device of some embodiments is coupled to the planar element and/or the substrate with a reflowed solder.

A method of mounting a semiconductor device is also disclosed, in which the semiconductor device has a first surface with at least one contact region and a second surface. The method provides a substrate that is adapted to receive the second surface of the semiconductor device. The method aligns the semiconductor device by coupling a planar element, which has an aperture that is sized to surround the semiconductor device, to the substrate. The method further couples the semiconductor device to the substrate.

The method of some embodiments includes the step of forming at least one conductive trace in the planar element. In some of these embodiments, at least one conductive trace is electrically coupled to at least one contact region. Some embodiments include the step of integrally forming a flap extending into the aperture and sizing the flap to overlap the semiconductor device. The flap of these embodiments typically includes an exposed conductive trace on the first surface. Preferably, the conductive trace is positioned to electrically couple to at least one contact region.

Some embodiments include the step of forming several flaps. Typically, each flap has an exposed conductive trace for making contact to a contact region. Some embodiments further include the step of forming several apertures in the planar element. In some of these embodiments, each aperture is adapted to receive and align a semiconductor device. Preferably, each of these apertures has at least one flap. The method of some embodiments further includes the step of reflowing solder to couple the semiconductor device to the substrate.

In a particular method of mounting, the method mounts an energy conversion type cell. The method places the cell near a predetermined location on a substrate. The cell includes at least one exposed contact region. The method mounts an electrically insulated flexible planar element having an aperture sized to surround the semiconductor device. The planar element typically includes a conductive trace. The method mounts the planar element to the substrate such that the aperture surrounds and aligns the cell. The method forms an electrical connection between the exposed contact region and the trace.

In some of these embodiments, the step of forming the planar element includes forming an integral flap adapted to overlap the cell. Preferably, the flap exposes the conductive trace in a position to contact the exposed contact region. The aperture and flap are typically formed by die punching the aperture and the flap in a single operation. Alternatively, the planar element or strip, including any apertures and/or flaps, is formed by laser cutting, steel rule die punching, and/or by another means.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

A co-pending patent application entitled "Concentrator Solar Photovoltaic Array with Compact Tailored Imaging Power Units," which is hereby incorporated by reference as the "HTG-1" application, describes a solar panel array with compact and efficient photovoltaic (PV) power units. The HTG-1 patent application generally pertains to the mechanical architecture of a clean energy system that uses an optical and/or solar concentrator. More specifically, the HTG-1 application describes a set of mirrors, a rod, spatial relationships, and alignment means for these components. The HTG-1 patent application further discusses the shape of mirrors, thermal management, glass structures, and other mechanical supports.

A separate co-pending patent application entitled "Optical System Using Tailored Imaging Designs," which is hereby incorporated by reference as the "HTG-2" application, describes an optical system that uses tailored imaging designs. The HTG-2 patent application generally discusses optical designs for mirrors, describes several variations for optical designs, and describes a particular light-emitting device. The disclosure of the HTG-2 patent application further includes sets of equations that describe the surfaces and their relevance to photo voltaics.

Despite these advances in the field, many challenges remain for concentrator technology. Broadly speaking, the improvements advanced above, and the challenges that remain may be categorized into several subfields within the optical concentrator field. For instance, these subfields might include issues relating to optics, thermodynamics, mechanics, manufacturing, and cost. More particularly, these issues represent tradeoffs and constraints within the field of concentrator technology. The discussion below addresses several of these issues, such as the issues relating to the mechanics, manufacturing, and costs of implementing cell arrays.

Method and Apparatus for the Implementation of Cell Arrays

Some embodiments of the invention provide a method and a means for substantially reducing the time to build, the complexity of construction, and/or the materials required for an optical concentrator. These concentrators are typically designed and constructed for use in an array that provides the combined power of the array to an external load.

Figure 1:
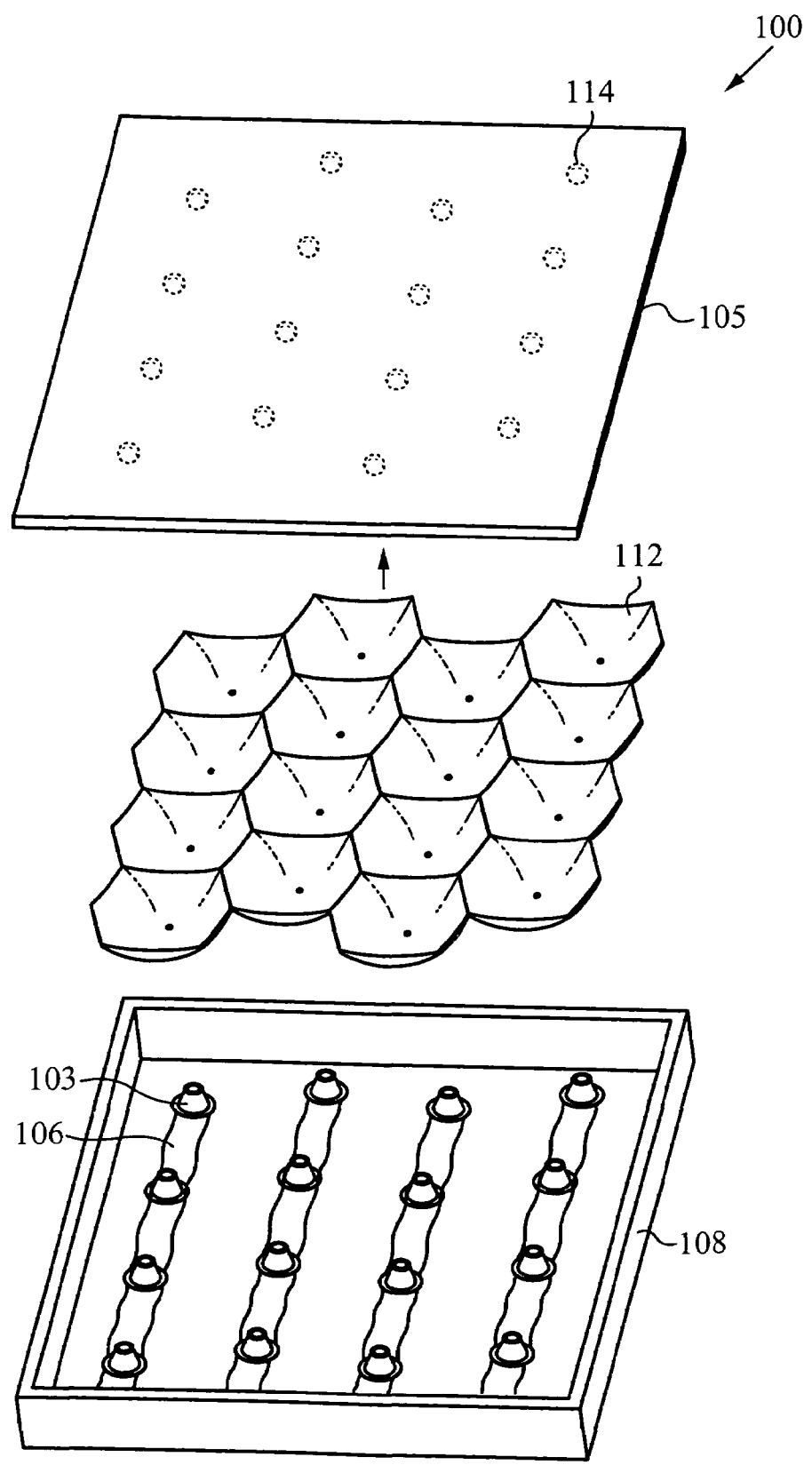
FIG. 1 illustrates an exploded view of an array of concentrators in accordance with some embodiments of the invention.
Figure 1A:
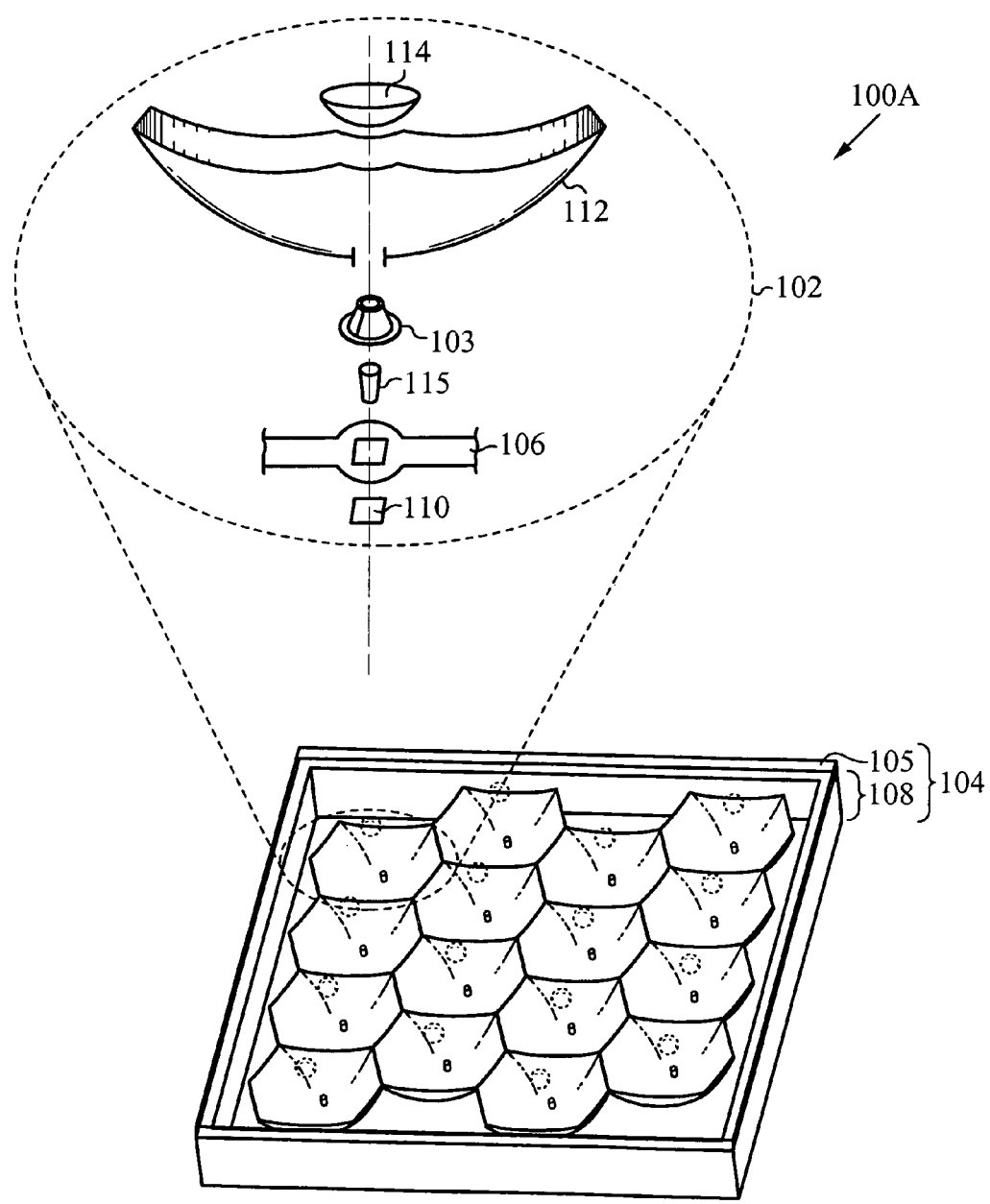
FIG. 1A illustrates a collapsed view of the array of FIG. 1, and an exploded view of a concentrator in the array, in further detail.

FIGS. 1 and 1A illustrate an array 100 of concentrators 102 in accordance with some embodiments of the invention. More specifically, FIG. 1 illustrates an exploded view of the array 100, while FIG. 1A illustrates a collapsed view. As shown in these figures, the array 100 includes several concentrators 102 arranged into rows and/or columns. FIG. 1A particularly illustrates that each concentrator 102 has several components, including a primary element 112, a secondary element 114, a third element 115 (such as a rod), a cone 103, a strip 106, and a cell 110. The primary elements 112 of some embodiments further have a particular shape, which allows coupling together to form a unibody and/or monocoque structure. For instance, the primary elements 112 of the concentrators 102 illustrated in FIG. 1 have a substantially hexagonal shape, which allows coupling in a honeycomb type configuration.

Regardless of the particular configuration of each element, the-concentrators 102 are preferably enclosed within a protective housing 104. The housing 104 of some embodiments includes a front plate 105, and a back panel 108. In some of these embodiments the back panel 108 is formed by using a metal material, such as aluminum, steel, and/or an alloy thereof, and the front plate 105 is formed by using a material that permits the passage of light, such as glass, acrylic, and/or polyolephin, for example. Accordingly, the array 100 is preferably exposed to light such that, through the front plate 105, each concentrator 102 receives energy from light radiation, and causes it to impinge on a converter which converts the light energy into an electric current.

As indicated in the figures, during assembly, the primary and secondary elements 112 and 114 are typically coupled to the front plate 105, while the other elements of each concentrator 102, such as the elements covered and/or protected by the cone 103, are preferably disposed in relation to the back panel 108.

The housing 104 of different embodiments has a variety of sizes. Moreover, the housing 104 of different embodiments includes particular shapes for purposes other than to accommodate different numbers of concentrators 102. One of ordinary skill recognizes additional shapes and sizes for the housing 104 of different embodiments.

As mentioned above, each concentrator 102 is preferably designed to concentrate the light energy equivalent to above one sun onto its solar cell 110. The cells 110 of these embodiments are coupled by various methods and configurations to allow the generated electric current to flow to a location external to the cell 110 and/or the array 100.

Figure 2:
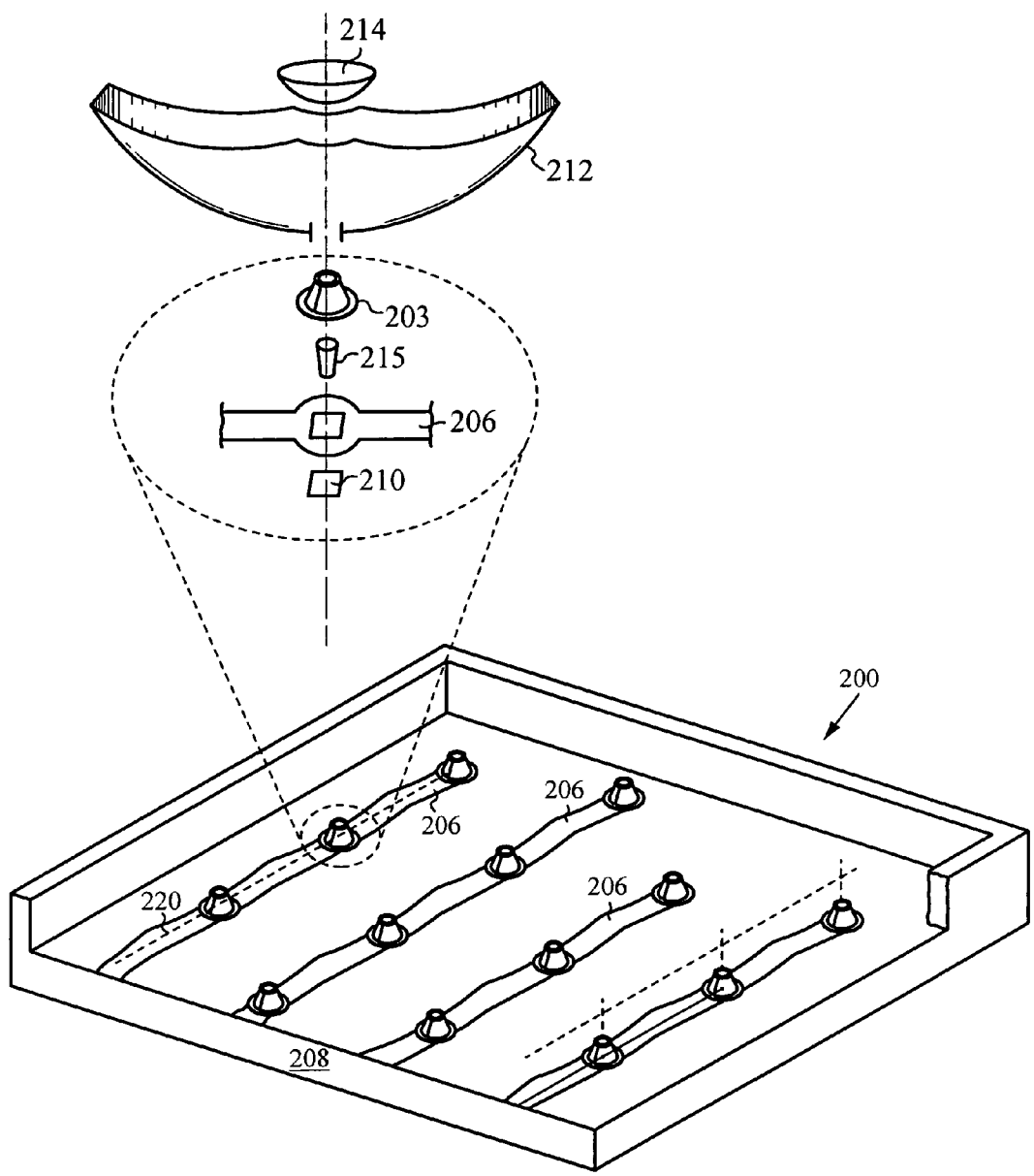
FIG. 2 illustrates a back panel for the array of FIGS. 1 and 1A, and an exploded view of a concentrator, in further detail.

In particular, FIG. 2 illustrates a back panel 208 for the array 100 of FIG. 1. As shown in this figure, each concentrator includes a cell 210 that is positioned at a predetermined location along a strip 206. Each strip 206 preferably has means for electrically coupling the cells 210 of the array 200 for delivery of generated electric power. For instance, the cells 210 are coupled by row and/or by column in a variety of desirable patterns. The means for electrically coupling can be a wire and is preferably a conductive trace.

Typically, the back panel 208 portion of the housing is formed of a metal material, such as, for example, aluminum, steel, and/or an alloy thereof. This type of material tends to have a combination of relative sturdiness, durability, malleability, and/or low weight while being cost effective. Further, the material selected for the back panel 208 allows the housing to dissipate some of the heat generated and collected during operation. In contrast, the strip 206 typically comprises an insulative and/or non conducting type material such as, for example, a polyimide based material. An example of such a material includes Kapton® provided by DuPont, Inc. However, one of ordinary skill recognizes additional suitable materials for the strip 206 such as, for example, liquid crystal polymers and/or polyester based materials, provided by the 3M™ company, and several other companies. As mentioned, the materials for the strip 206 and/or the housing are advantageously selected in the embodiments above, in part, for their ease of use in configuration, manufacture, low weight, durability, and/or for their relatively low cost.

Figure 3:
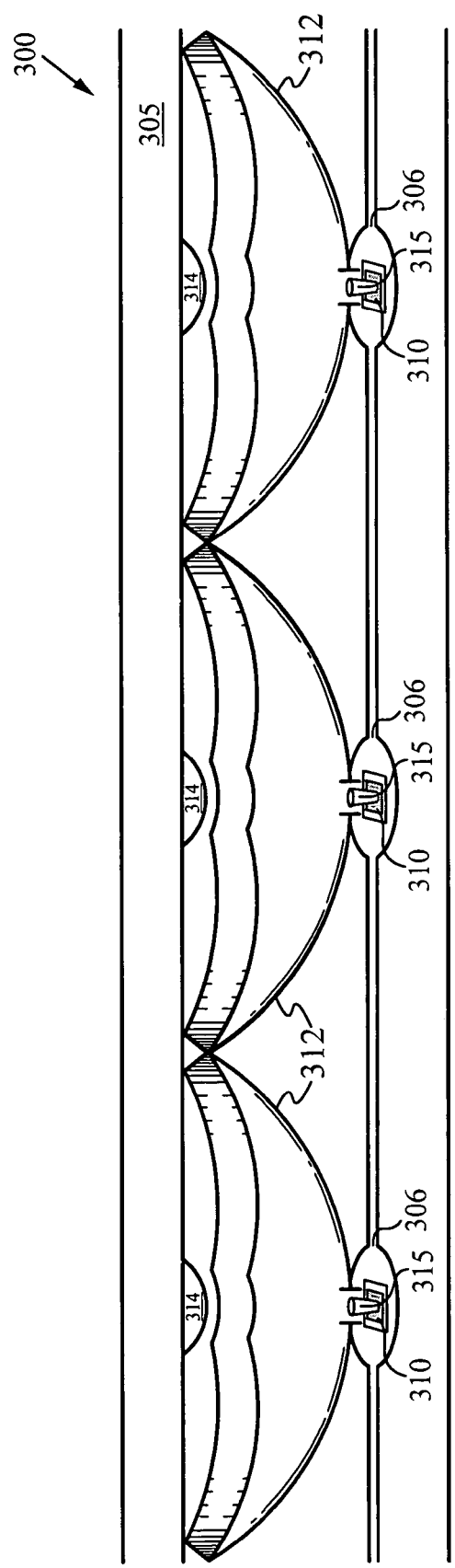
FIG. 3 illustrates an exemplary row of concentrators along a strip.
Figure 3A:
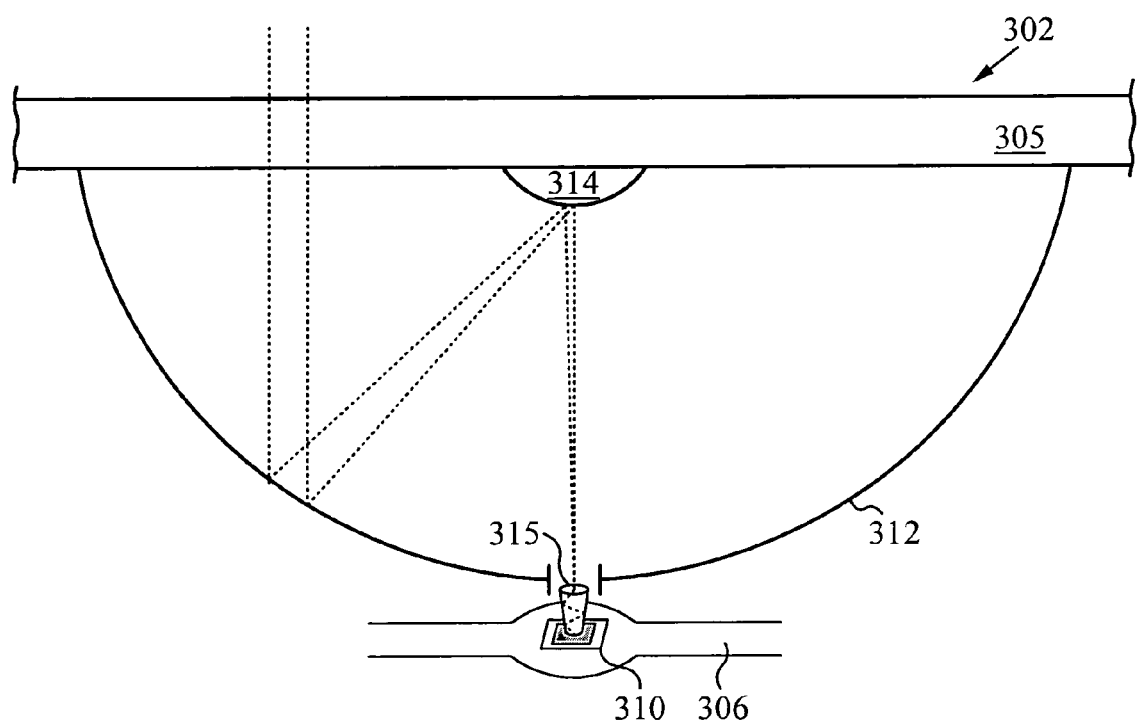
FIG. 3A illustrates a concentrator of some embodiments in further detail.

FIGS. 3 and 3A illustrate a concentrator 302 of some embodiments, such as in the array 100 of FIG. 1, in further detail. As shown in FIG. 3, the concentrator includes a first element 312, a second element 314, and a cell 310. The cell 310 is preferably placed and/or aligned along a strip 306. The first and second elements 312 and 314 are used to direct light toward the cell 310. For instance, in some embodiments, the first and second elements 312 and 314 are reflective optical elements, such as mirrored surfaces, for example. In these embodiments, light typically reflects from the first or primary element 312 to the second or secondary element 314, and from the secondary element 314 to the cell 310. Some embodiments further include a third optical element 315, such as a glass, acrylic, and/or polyolephin rod, for example. In these embodiments, the third element 315 receives light at one end and preferably directs the received light to the cell 310, at another end.

FIG. 3A illustrates such an embodiment for light concentration in further detail. As shown in this figure, the concentrator 302 includes three optical elements: a primary reflector 312, a secondary reflector 314 and a rod 315, for collecting, directing and/or concentrating energy from a light source. In particular embodiments, a portion of the primary and secondary elements 312 and 314 are preferably co-planar. This allows the primary and secondary elements 312 and 314 to be mounted to a single sheet of glass, or similar transparent material (305). Typically, radiation energy in the form of light waves strike the primary reflector 312, which concentrates the energy onto the secondary reflector 314. The secondary reflector 314 then redirects the energy onto the cell 310. Optionally, the cell 310 receives the directed light through the glass rod 315.

As illustrated in the figure, the primary reflector 312 of some embodiments has a particular concave surface, while the secondary reflector 314 of these embodiments has a convex surface. Hence, in this implementation, the radiation that is typically received by the primary reflector 312 is from a single sun, while the concentrated energy that is directed onto the cell 310 has the equivalent of more than one sun, such as, on the order of 500 suns, for example. The amount of concentration of sun energy is related to the approximate area of the primary reflector 312, less the approximate area of the secondary reflector 314 (less optical losses), in ratio to the approximate area of the cell 310. Regardless of the degree of optical concentration, the cell 310 preferably converts the concentrated light energy into an electrical current.

As mentioned above, the manufacture of such a concentrator 302 presents certain challenges. For instance, one difficulty lies in properly placing or aligning the cell 310 such that the concentrated light optimally strikes the cell 310 at a preferred energy conversion region. While recent advances in cell and/or reflector technology have increased the amount of permissible deviation from perfect alignment, to a reasonable acceptance angle of up to as high as about plus or minus one degree, it is still essential, as with most semiconductor mounting applications, for a placement, alignment, and/or mounting of the cell 310, to occur with a high degree of reliability and precision.

Moreover, as is also the case with most semiconductor applications, the cell 310 is typically arranged in conjunction with several electronic devices and/or cells in a particular relatively precise configuration, such as the array 100 of FIG. 1. Unlike many typical semiconductor applications, however, the cells 102 in the array 100 of FIG. 1 further have requirements for a design that preferably allows quick assembly, disassembly, and/or servicing in the field. Some embodiments provide such a means for placing, aligning and/or mounting.

Figure 4:
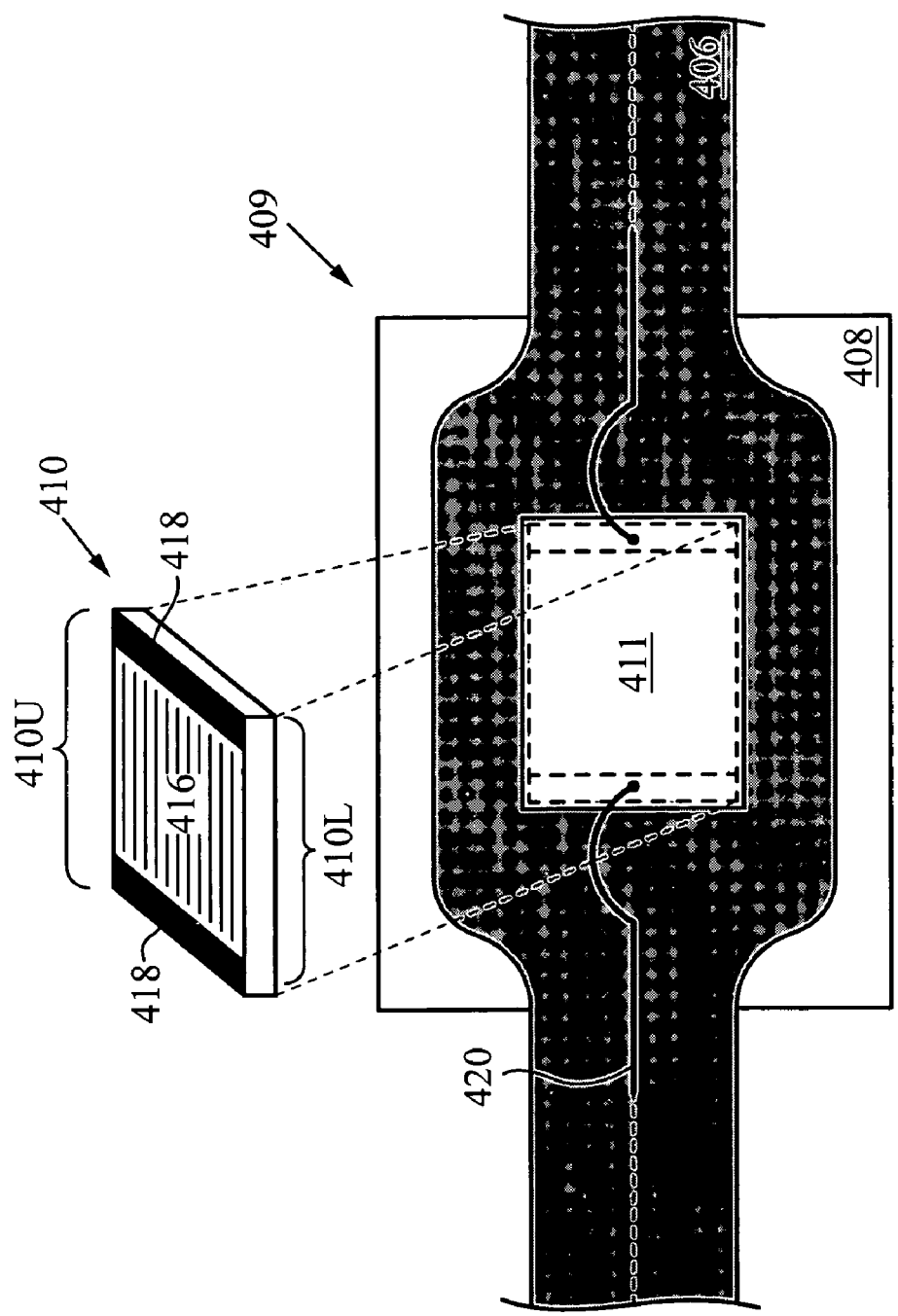
FIG. 4 illustrates a plan view of a cell and mount in accordance with some embodiments.

For instance, FIG. 4 illustrates a plan view of a mount 409 for a semiconductor device, such as a cell 410, in accordance with some embodiments. As shown in this figure, the cell 410 includes an upper first surface 410U and a lower second surface 410L. The cell 410 typically includes a conversion region 416 that is capable of converting light waves into electrical current. Hence, the cell 410 of some of these embodiments includes a photo voltaic (PV) type cell.

Further, the cells 410 of some embodiments include standard silicon (Si), cadmium-tellurium (Cd/Te), double junction, triple junction, and/or four junction type cells. Currently, triple junction cells have particular advantages in the art. For instance, the cell 410 of some of these embodiments comprises several distinct materials that capture and/or convert several ranges of the light spectrum into electrical energy. The materials of some embodiments include gallium indium di-phosphide ($GaInP_2$), gallium arsenide (GaAs), and/or germanium (Ge), for example. Such a triple junction cell is provided by, for example, Sharp Semiconductor of Japan, Emcore of Albuquerque, N. Mex., and Spectrolab of Sylmar, Calif., and has been known to achieve a photo electric conversion efficiency of about 39%. However, one of ordinary skill recognizes that the cells 410 of alternative embodiments include different materials and/or different efficiencies.

As shown in FIG. 4, the mount 409 includes a strip 406 for placing, aligning, and/or coupling the cell 410. More specifically, the strip 406 of some embodiments has an aperture 411 that is preferably sized to approximate the dimensions of the cell 410, such that when the strip 406 is placed in a desired configuration, the aperture 411 serves as a template for the guided and/or aligned placement of the cell 410, on a substrate 408 such as a heat spreader for thermal and/or electrical coupling to the heat spreader. As described below, the heat spreader is in turn typically thermally coupled to, but electrically insulated from, a back panel of a housing. One of ordinary skill recognizes that the entire aperture 411 is not necessary, or is not necessarily sized, to align the cell 410. For instance, some embodiments employ a portion of the aperture 411 such as one or more corners, for example, to align the cell 410.

Preferably, the cell 410 is thermally and/or electrically coupled to the substrate 408, which typically includes a heat spreading device. Also preferably, the strip 406 is secured to the substrate by using immobilizing or locking means such as by rivets, solder, and/or studs, for example. In these implementations, the strip 406 serves the additional purpose of providing an insulation layer for the metal of the rivets, studs, and/or substrate. For instance, the strip 406 prevents undesirable electrical contact. The strip 406 of some embodiments further includes several apertures 411, for the placement and or alignment of several cells 410, such as for a linear row and/or column of an array. Such an embodiment is illustrated in FIG. 3.

Also shown in FIG. 4, the cell 410 includes one or more busbars 418 that are used for coupling one or more wires or conductive traces 420. The busbars 418 typically receive the electrical energy converted by the conversion region 416 in the form of an electric current. Preferably, the cell 410 includes two or more busbars 418 that are located around a periphery of the cell 410. These cells 410 typically have advantageous energy conversion and/or transfer properties since the current generated in the conversion region 416 has a shorter distance to travel to reach a busbar 418 for the energy transfer out of the cell.

The conductive traces 420 allow the electric current to flow to a location remote from the busbars 418 and the cell 410. In furtherance of this objective, the traces 420 of some embodiments are advantageously integrated into the strip 406 to provide guidance, insulation, and/or protection for the traces 420 of these embodiments. For instance, the integrated traces 420 and strips 406 of some embodiments further permit the cells 410 of these embodiments to be organized into conveniently handled and/or secured rows or columns, such as for the array described above in relation to FIGS. 1, 2 and 3.

Figure 5:
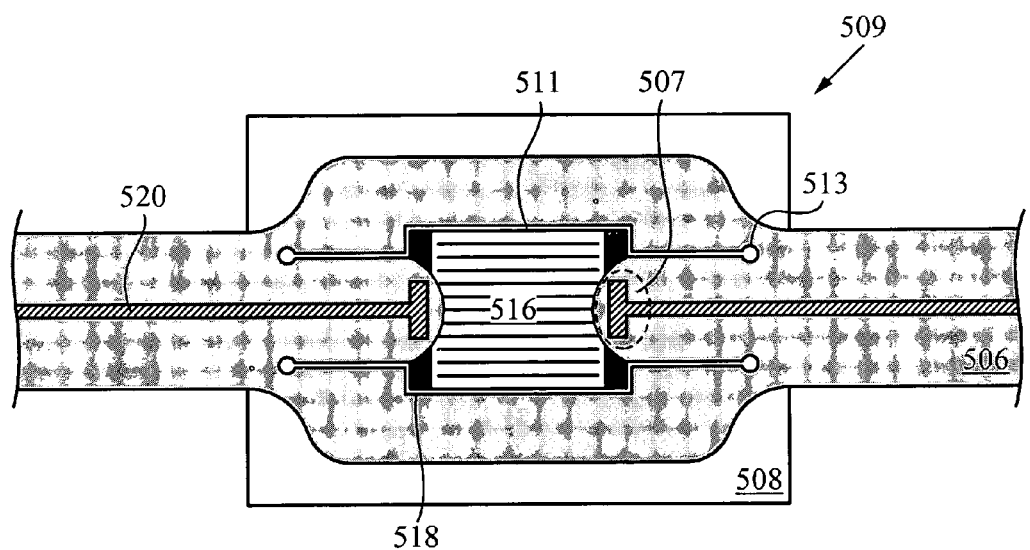
FIG. 5 illustrates a plan view of a cell mount, according to some embodiments.

FIG. 5 illustrates some of these embodiments in further detail. As shown in this figure, the strip 506 includes one or more integrated flaps 507 that include an exposed region for the embedded wire or trace 520. The flaps 507 of these embodiments extend into the aperture 511 and preferably permit the exposed region of the conductive trace 520 to electrically couple to one or more of the busbars 518 at the first surface of the cell 510. These embodiments further provide mechanical and/or electrical coupling for the cell 510. When coupled to the busbars 518, the flaps 507 typically lie in a plane that is different than the remainder of the strip 506. Hence, some embodiments include one or more small holes 513 that provide tension relief along a cut line that separates the flap 507 from the strip 506.

Advantageously, some embodiments form the aperture(s) 511, the flap(s) 507, and/or the relief holes 513, in a single die punching step. Further, some embodiments form the thermal and/or electrical coupling between the conductive traces 507 and the busbars 518, and/or between the second surface 510L of the cell 510 and the substrate 503, at once by using a combined solder reflow process.

Figure 6:
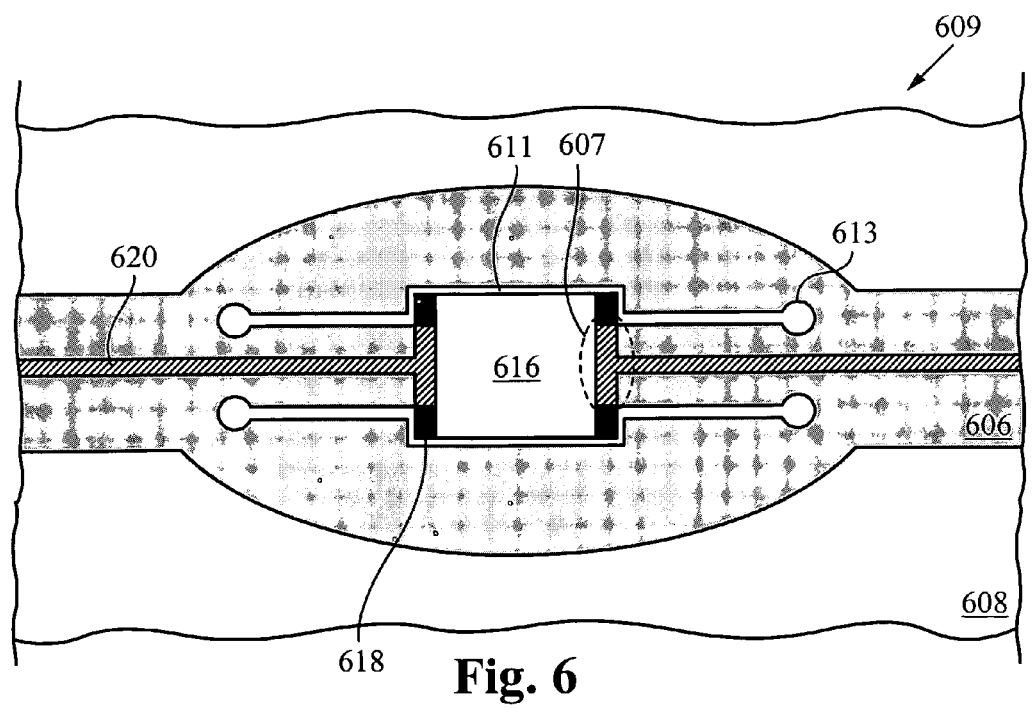
FIG. 6 illustrates a plan view of a cell mount, according to some embodiments.

FIG. 6 illustrates an additional embodiment having flaps 607 and tension relief holes 613. As shown in this figure, the particular shapes and dimensions vary in different embodiments. For instance, the strip 606, the aperture 613, the flaps 607, the relief holes 613, and/or the exposed region of the conductive traces 620, are shaped and/or sized in relation to a particular set of implementation requirements. These requirements include, for example, different semiconductor device sizes and/or shapes, varying degrees of conductivity, and other electrical, optical, and/or mechanical requirements.

Figure 7:
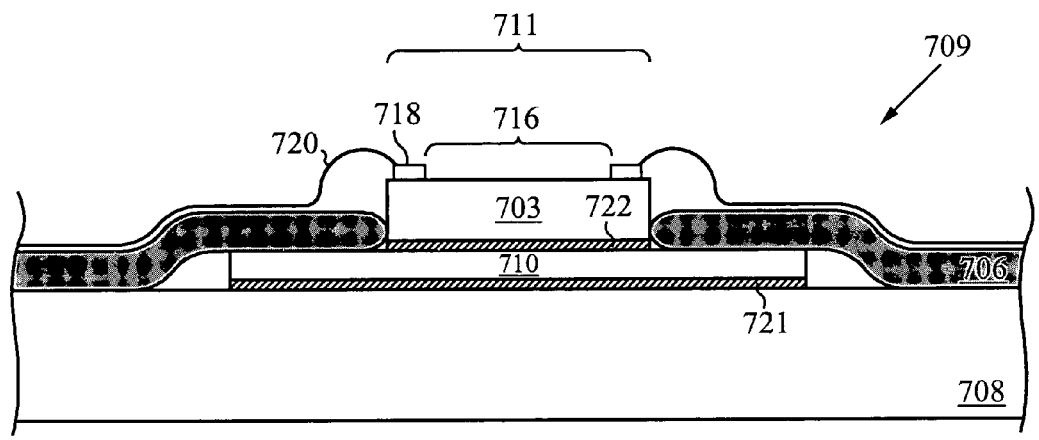
FIG. 7 illustrates a side view of the mount of FIG. 4.

FIG. 7 illustrates a side view 707 of the mounting configuration for the mount 409 of FIG. 4. As shown in FIG. 7, the cell 703 has a conversion region 716 and busbars 718. The conversion region 716 particularly includes one or more materials that are suitable for energy conversion over a broad spectrum of wavelengths. The cell 703 is typically aligned within the aperture 711 of a strip 706. More specifically, the second surface of backing of the cell 703 is preferably coupled to a heat spreading device 710, which is typically coupled in turn to a back panel 708, for additional heat removal and/or dissipation from the cell 703. The heat spreader 710 includes any number of heat dissipation means, such as a copper heat sink and/or thermal adhesive, for example. In some embodiments, the coupling between the heat spreader 703, and or the back panel 708 is formed by using a thermal transfer material 721. Such a material 721 preferably allows thermal transfer, but prevents electrical conductance between the heat spreader 710 and the back panel 708. In contrast, the adhesive layer 722 between the cell 703 and the heat spreader 710 is typically both thermally and electrically conducting as is the case with a solder, for example.

The cell 710 is further coupled to a set of conductors 720 by using the busbars 718. In particular embodiments, the couplings include soldering, such as by a solder reflow process, for example. As described above, some embodiments form multiple couplings in a single reflow process. In these embodiments, the strip 706 is advantageously resistant to heat and is therefore unaffected during the coupling and/or reflow process.

Figure 8:
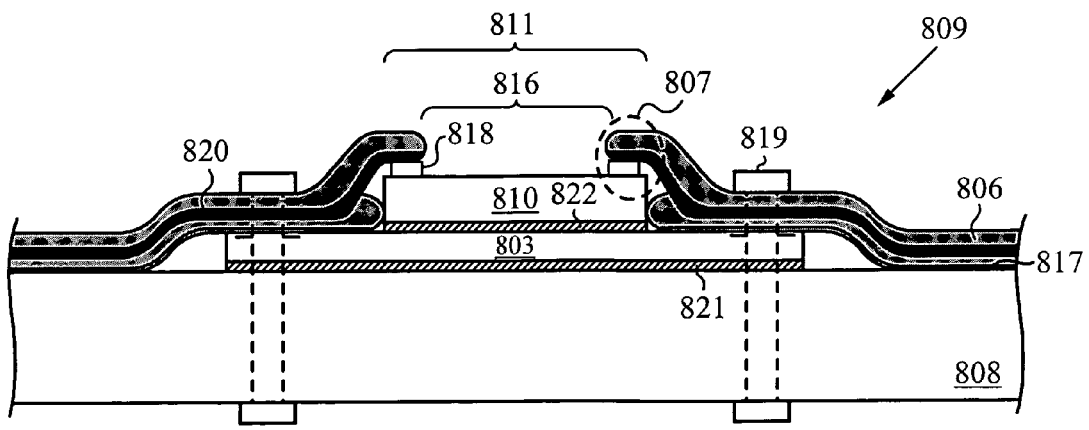
FIG. 8 illustrates a side view of the mount of FIG. 5 and/or FIG. 6.

Also mentioned above, the conductors 720 of some embodiments are integrated with the strip 706 as conductive traces. Such an embodiment is illustrated in FIGS. 5 and 6, and FIG. 8 illustrates a side view of the mount 809 illustrated in these figures. As described above, the conductors 820 can be wires or conductive traces which allow electric current generated at the conversion region 816 to flow from the busbars 818 through the conductors 820 to a location external to the cell 810. Typically, the external location includes a load and/or a battery, for example.

In a particular embodiment, the busbars 818 at the first surface of the cell 810 provide a negative terminal for the flow of charge, while the second surface provides a positive terminal. In this embodiment, the strip 806 preferably includes additional conductive traces 817 that are electrically coupled to the metal of the heat spreader 803. Hence, in these embodiments, the heat spreader 803 is both thermally and electrically coupled to the positive second surface of the cell 810, while the heat spreader 803 is preferably only thermally coupled to the back panel 808. As mentioned above, this is typically accomplished by using, between the heat spreader 803 and the back panel 808, a thermal transfer material 821 that is electrically insulating. The electrical coupling of the positive terminal (the second surface of the cell 810) to the additional conductive traces 817 (through the heat spreader 803) is typically achieved by using a both thermally and electrically conductive layer 822, in conjunction with the mechanical binding of the metal rivets and/or studs 819 described above in relation to securing the strip 806 to the panel 808. For the both thermally and electrically conductive layer 822, some embodiments use solder paste, for example.

Accordingly, the heat spreader 803 is also preferably electrically insulated from the rivets 819. For instance, some embodiments use a hole in the strip 806 that is smaller than a hole in the heat spreader 803 such that the rivet 819 passes through the strip 806 and heat spreader 806 without making any electrical contact with the heat spreader 806. In this manner, the strip 806 further provides electrical contact for one or more portions of the cell 810, while being electrically insulated from the back panel 808 and the environment.

While the foregoing describes an implementation incorporating an insulative strip with integrated conductive traces in conjunction with a cell having negative terminal busbars and a positive terminal second surface, one of ordinary skill recognizes different configurations for the positive and negative terminals and the flow of charge in alternative embodiments.

Hence, as illustrated in FIG. 3 a plurality of cells 310 are aligned and/or mounted along the strip 306. As shown in this figure, the strip 306 permits the cells 310 to be coupled in a variety of advantageous configurations. Moreover, the conductors 320 are preferably also guided along the strip to further support a variety of advantageous electrical coupling configurations such as, for example, series, parallel, and/or series-parallel configurations.

Figure 9:
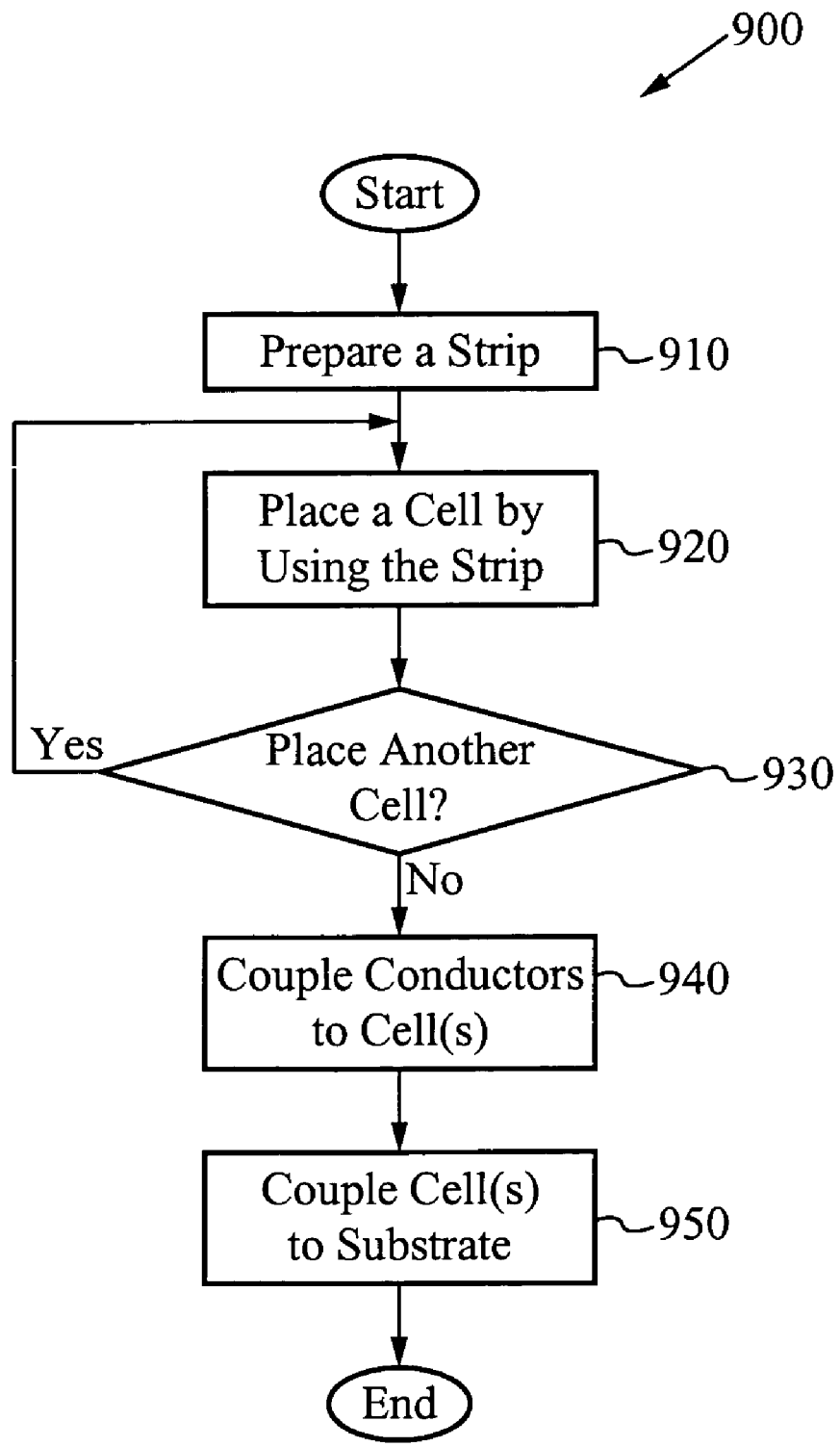
FIG. 9 illustrates a process of forming a cell module in accordance with some embodiments of the invention.

FIG. 9 illustrates a process 900 for mounting a semiconductor device, which in some embodiments, includes an energy conversion type cell. As shown in FIG. 9, the process 900 begins at the step 910, where a strip is prepared. Some embodiments prepare the strip by forming one or more apertures and/or flaps. As mentioned above, the apertures are preferably sized to approximate the dimensions of the semiconductor device, thereby allowing the guided placement and/or alignment of the semiconductor device. Also mentioned above, some embodiments form the apertures, flaps, and/or relief holes in a single die punch step.

Some embodiments further integrate one or more conductive traces into the strip. Some of these embodiments shape the flaps and expose a portion of the conductive traces such that the flaps extend into the aperture a sufficient distance to permit coupling to a busbar on the first surface of the cell. As also mentioned above, the strip of some embodiments is insulative and/or non conductive of electrical current. The conductive traces or wires of these embodiments, regardless of integration, provide electrical contact for one or more cells. Preferably, the strip is further prepared by securing the strip in a predetermined orientation and/or location along a substrate, such as a back panel for a concentrator. The securing means typically includes a hermetic binding means, such as a set of rivets and/or studs, for example.

Once the strip is prepared at the step 910, then at the step 920, a cell is placed at a predetermined location by using the strip. Preferably, the cell includes a conversion region and is placed, oriented, and/or aligned by using the strip such that the conversion region is exposed to receive light energy. Typically, several cells are placed on a single strip to form a row or a column for an array of cells. As described above, the cells typically include one or more busbars each. Some embodiments further include a step for aligning the cell by using the dimensions of one or more apertures within the strip at the step 920.

After the cell is placed and/or aligned at the step 920, the process 900 transitions to the step 930, where a determination is made whether to place another cell. If another cell is to be placed, the process 900 returns to the step 920 where the additional cell(s) are placed, otherwise the process 900 transitions to the step 940.

Once it is determined, at the step 930, that no more cell(s) are to be placed and/or aligned, the process 900 transitions to the step 940, where one or more conductive traces or wires are coupled to the busbar(s) of each cell. When the strip includes conductive traces, the strip further preferably includes one more flaps that extend into each aperture. The flaps of these embodiments typically expose the conductive traces to the busbars of each cell.

Hence, the traces are typically guided along each strip and coupled in particular configurations to advantageously combine the electric current generated by each cell such that when the cell is exposed to light radiation, an electric current is transferred from the cell to a location external to the cell. In this manner, the combined energy from the row, column, and/or array of coupled cells, is advantageously harnessed and utilized. As mentioned above, the traces and busbars of some embodiments are coupled by using a solder reflow process.

Then, after the step 940, the process 900 transitions to the step 950, where the second surface, the substrate, and/or an optional heat spreader are thermally and/or electrically coupled. As mentioned above, the coupling is formed in some embodiments by a solder reflow process. Also mentioned above, the coupling between the traces and busbars of the cell and/or between the second surface of the cell, the substrate, and/or the heat spreader, advantageously occurs in a combined solder reflow process. After the step 950, the process 900 concludes.

One of ordinary skill recognizes variations in the process 900 of FIG. 9. For instance, the cells are alternatively coupled to the substrate (at the step 950) before the busbars are coupled to the traces (at the step 940), or the couplings occur one at a time, or at substantially the same time.

Figure 10:
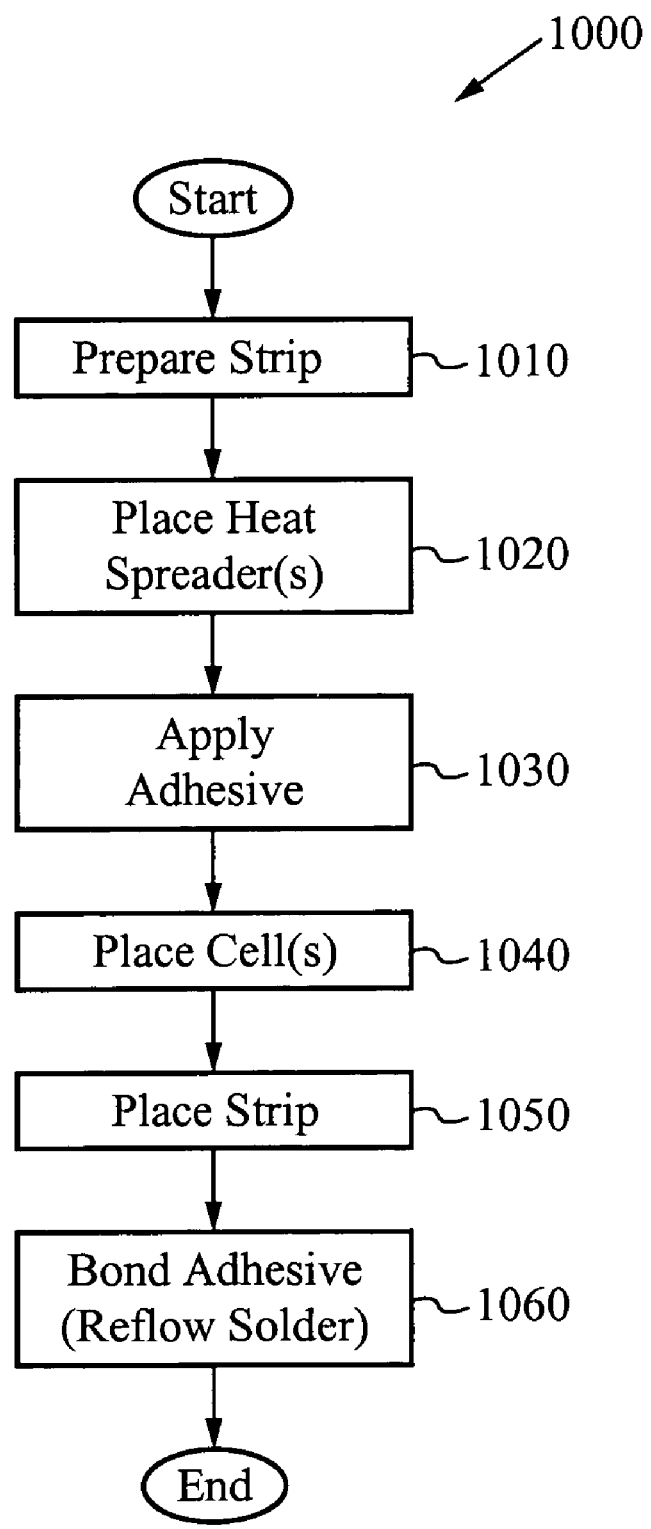
FIG. 10 illustrates a process of mounting a cell in accordance with some embodiments.

FIG. 10 illustrates a process 1000 for mounting a cell in further detail. As shown in this figure, the process 1000 begins at the step 1010, where a strip is prepared. Then, the process 1000 transitions to the step 1020, where one or more heat spreader(s) are placed on a fixture such as, for example, the back panel of a housing. The back panel is typically sized to accommodate all the heat spreaders and cells that are for mounting by using the prepared strip. In some embodiments, an electrically insulating layer is placed between the heat spreader(s) and the back panel. This layer preferably allows thermal conductance, but prevents electrical conductance between the heat spreaders and the back panel. Next, the process 1000 transitions to the step 1030, where a thermal adhesive such as solder paste, for example, is applied to the heat spreader(s). Preferably, the solder paste differs from the insulating layer, in that the solder paste is both electrically and thermally conducting, while the insulating layer is only thermally, but not electrically conducting. Then, at the step 1040, the cells are placed onto the solder paste, and at the step 1050, the strip is placed over the cells, the solder paste, and the heat spreaders. As described below, the strip preferably serves as a template to guide and/or orient each cell.

Once the strip is placed at the step 1050, the process 1000 transitions to the step 1060, where the solder paste is reflowed to adhere the cells to the heat spreader(s) in a fixed position. Preferably, during the reflow step 1060, the cells are oriented and/or aligned by a set of apertures in the strip. For instance, typically one or more corners of each cell are guided by one or more corners of each aperture in the strip. Once the cells are oriented and/or aligned in a fixed position at the step 1060, the process 1000 concludes.

Accordingly, the construction and materials of particular implementations, such as the strips and wires of the embodiments described above, have particular advantages. These advantages include ease and speed of use, flexibility, and/or low cost. For instance, some of the concepts discussed above are advantageously implemented in small reflective concentrators, which dramatically reduces the cost of generating and providing solar electricity. These concentrators are then further advantageously configured into a panel array and enclosed in a compact and robust housing. Such a panel is capable of operating at approximately 500 suns to produce 250 Watts of peak electrical power when equipped with Spectrolab 10 millimeter by 10 millimeter terrestrial triple-junction cells. By further employing the design and materials described above, this system is capable of manual or semi-automated production, which is relatively simple and quick, and has a low overall manufacturing cost.

Alternatively, some embodiments employ semiconductors that have different dimensions, such as smaller multi junction cells, for example. These smaller cells have a lower cost and thus permit a reduced price per watt. In addition, the small size of these cells increases their efficiency, due to lower series resistance and smaller top busbar losses. Moreover, the smaller cells allow higher yield dicing methods that increase wafer utilization and further reduce manufacturing costs. As described above, embodiments of the invention are conveniently adapted and optimized for these types of semiconductor devices, as well.

While the invention has been described with reference to numerous specific details, one of ordinary skill in the art will recognize that the invention can be embodied in other specific forms without departing from the spirit of the invention. For instance, while embodiments of the invention have primarily been described for implementations involving an energy conversion cell, one of ordinary skill will recognize that other types of semiconductor devices are used in additional embodiments. Thus, one of ordinary skill in the art will understand that the invention is not to be limited by the foregoing illustrative details, but rather is to be defined by the appended claims.

We claim:

1. A mount for a semiconductor device having a first surface with at least one contact region and a second surface, the mount comprising:
   a. a planar substrate to receive the second surface of the semiconductor device;
   b. an element having an aperture sized to surround the semiconductor device wherein a first surface of the element is mounted to the substrate and is located to surround the semiconductor device such that the semiconductor device is aligned by the aperture; and
   c. a means for mounting the semiconductor device to the substrate in an aligned position wherein the semiconductor device comprises an energy conversion type cell.

2. The mount according to claim 1, wherein the element is mounted to the substrate in a predetermined location.

3. The mount according to claim 1, wherein the element comprises a flexible electrically insulated material.

4. The mount according to claim 1, wherein the element further includes at least one conductive trace electrically coupled to the at least one contact region.

5. The mount according to claim 1, wherein the element further comprises an integrally formed flap extending into the aperture and sized to overlap the semiconductor device, wherein the flap includes an exposed conductive trace on the first surface and positioned to electrically couple to the at least one contact region.

6. The mount according to claim 5 further comprising a plurality of flaps, each flap having the exposed conductive trace making contact to the at least one contact region.

7. The mount according to claim 1, wherein the element comprises a plurality of apertures each adapted to receive and align a semiconductor device and each aperture having at least one flap.

8. The mount according to claim 1, wherein the semiconductor device is coupled to the element with a reflowed solder.

9. The mount according to claim 1, wherein the semiconductor device is coupled to the substrate with a reflowed solder.

10. A mount for a semiconductor device having a first surface with at least one contact region and a second surface, the mount comprising:
    a. a planar substrate to receive the second surface of the semiconductor device;
    b. an element having an aperture sized to surround the semiconductor device wherein a first surface of the element is mounted to the substrate and is located to surround the semiconductor device such that the semiconductor device is aligned by the aperture; and
    c. a means for mounting the semiconductor device to the substrate in an aligned position wherein the semiconductor device comprises an energy conversion type cell;
    wherein the contact region of the first surface of the semiconductor device comprises a negative terminal for the cell,
    wherein the second surface of the semiconductor device comprises a positive terminal for the cell,
    wherein the element comprises a first conductive trace for the negative terminal, and a second conductive trace for the positive terminal,
    wherein the element is configured to position the first and second conductive traces in relation to the negative and positive terminals, and
    wherein the element is configured to insulatively separate the first and second conductive traces.

11. A method of mounting a semiconductor device having a first surface with at least one contact region and a second surface, the method comprising:
    providing a planar substrate adapted to receive the second surface of the semiconductor device;
    aligning the semiconductor device by coupling an element having an aperture sized to surround the semiconductor device to the substrate; and
    coupling the semiconductor device to the substrate, wherein the semiconductor device comprises an energy conversion type cell.

12. The method according to claim 11, including the step of mounting the planar element to the substrate in a predetermined location.

13. The method according to claim 11, including the step of forming at least one conductive trace in the element, wherein at least the one conductive trace is electrically coupled to the at least one contact region.

14. The method according to claim 13, further comprising:
    the step of integrally forming a flap extending into the aperture; and
    sizing the flap to overlap the semiconductor device, wherein the flap includes an exposed conductive trace on the first surface and positioned to electrically couple to the at least one contact region.

15. The method according to claim 14, further comprising the step of forming a plurality of flaps, each flap having the exposed conductive trace making contact to the at least one contact region.

16. The method according to claim 11, further comprising the step of forming a plurality of apertures in the element each adapted to receive and align a semiconductor device and each aperture having at least one flap.

17. The method according to claim 11, further comprising the step of reflowing solder to couple the semiconductor device to the substrate.

18. The method according to claim 11, further comprising:
    providing a negative terminal by using the first surface;
    providing a positive terminal by using the second surface;
    positioning a first conductor for the negative terminal;
    positioning a second conductor for the positive terminal;
    insulatively separating the first and second conductors by using the element;
    coupling the first conductor to the negative terminal; and
    coupling the second conductor to the positive terminal.

19. The method according to claim 18, wherein the step of forming the element includes forming an integral flap adapted to overlap the cell, wherein the flap exposes a conductive trace to contact the at least one exposed contact region, wherein the aperture and flap are formed by die punching the aperture and the flap in a single operation.

20. A method of mounting an energy conversion cell comprising the steps of:
- placing the cell near a predetermined location on a substrate wherein the cell includes at least one exposed contact region;
- mounting an electrically insulated flexible element having an aperture sized to surround the cell and further includes a conductive trace formed therein; and
- mounting the element to the substrate such that the aperture surrounds and aligns the cell forming an electrical connection between the at least one exposed contact region and the conductive trace.

* * * * *